US006081602A

United States Patent [19]

Meyer et al.

[11] Patent Number: 6,081,602

[45] Date of Patent: Jun. 27, 2000

[54] ARRAYABLE TWO-WAY LOUDSPEAKER SYSTEM AND METHOD

[75] Inventors: John D. Meyer, Berkeley; Paul J. Kohut, Pacheco; Justin Baird, Berkeley, all of Calif.

[73] Assignee: Meyer Sound Laboratories Incorporated, Berkeley, Calif.

[21] Appl. No.: 08/914,838

[22] Filed: Aug. 19, 1997

[51] Int. Cl.[7] .......... H03G 5/00

[52] U.S. Cl. .......... 381/99; 381/98; 381/182

[58] Field of Search .......... 381/342, 182, 381/99, 98, 87, 89, 332, 103, 340, 386; 181/144

[56] References Cited

U.S. PATENT DOCUMENTS

| | | | |
|---|---|---|---|
| 4,227,050 | 10/1980 | Wilson | 381/99 |
| 4,348,750 | 9/1982 | Schwind | 381/160 |
| 4,554,414 | 11/1985 | House | 381/182 |
| 5,590,214 | 12/1996 | Nakamura | 381/182 |

*Primary Examiner*—Vivian Chang
*Attorney, Agent, or Firm*—Donald L. Beeson

[57] ABSTRACT

An arrayable loudspeaker system having a horn-loaded high frequency compression driver and a low frequency cone driver radiates acoustic energy from a focal point in a polar radiation pattern having amplitude and phase and includes a signal conditioning circuit for amplitude equalization and phase correction. The horn of the system's horn-loaded compression driver is designed in cooperation with the signal conditioning circuit such that the focal point of the loudspeaker system is substantially frequency independent over the operating frequency range of the loudspeaker system and such that over this operating frequency range the loudspeaker's focal point remains substantially fixed in space. Any two or more of such loudspeaker systems can be arrayed by aligning them in respect to their frequency independent focal points and by rotating the loudspeakers about an axis passing through the aligned focal points to obtain a desired coverage. To facilitate alignment, suitable visual or mechanical indicators or locators can be placed on the tops and bottoms of the arrayable loudspeaker systems.

11 Claims, 8 Drawing Sheets

ARRAYABLE TWO-WAY LOUDSPEAKER SYSTEM AND METHOD

BACKGROUND OF THE INVENTION

The present invention generally relates to sound reinforcement, and more particularly to arrayable loudspeaker systems and techniques for arraying such systems. The invention also relates to two-way loudspeaker systems utilizing a horn loaded compression driver for the high frequency end of the system and a low frequency cone driver, sometimes referred to as a "direct radiator," for reproducing sound at the low frequency end of the system.

Two-way loudspeakers using horn loaded compression drivers for the high frequencies and direct radiators for the low frequencies are well known. The beam width of such loudspeakers typically changes with frequency resulting in non-uniform coverage. Also, when two or more speakers are arrayed and have overlapping coverages, they usually interact to produce combing effects which makes it difficult to design an array of speakers that perform in a desired and predictable fashion.

The present invention provides a loudspeaker system having a uniform polar response over a wide frequency range and which also has the benefit of producing minimum side lobes. The loudspeaker system and method of the invention also provides for predictable array design without combing by providing a common, fixed focal point about which two or more loudspeaker systems can be arrayed.

SUMMARY OF THE INVENTION

Briefly, the invention involves an arrayable at least two-way loudspeaker system having a horn-loaded high frequency driver, which radiates acoustic energy from an focal point in a polar radiation pattern having amplitude and phase. In accordance with the invention, the high frequency driver horn is sized and provided with a flare rate that places its frequency dependent focal point relatively close to the frequency dependent focal point of the speakers low frequency driver. By conditioning the audio signal to the drivers, including choosing the frequency range in which the drivers operate and by choosing suitable horn design parameters including flare rate, a common frequency independent focal point is achieved over the operating frequency range of the loudspeaker system allowing easy arrayability of the speaker. Generally, the invention contemplates the use of linear driver components to provide a linear system that can be combined with other similarly constructed linear systems to produce predictable responses.

More specifically, the loudspeaker system of the invention comprises a cabinet having a front baffle board, a low frequency cone driver, suitably a 12 inch driver, mounted to the cabinet's front baffle board, and a horn loaded high frequency compression driver having a horn with a mouth end mounted to the baffle board of the cabinet adjacent to the low frequency driver. It additionally includes a conditioning circuit having an audio signal input, a high frequency channel connected to the high frequency compression driver, a low frequency channel connected to the low frequency cone driver, and a crossover circuit for dividing an audio signal applied to the audio signal input between the high frequency channel and the low frequency channel. Typically, the cross-over will be chosen such that the horn driver operates above approximately 1000 to 2000 Hz, with the low frequency cone driver operating below the cross-over frequency. The signal conditioning circuit further includes amplitude equalization circuit means for equalizing the amplitude of the polar pattern of the speaker system over the system's operating frequency range, and phase connection circuit means for correcting the phase of the polar pattern. The horn of the horn loaded high frequency driver and the signal conditioning circuit operates together to produce a polar pattern from both drivers of the loudspeaker system which radiates from an focal point that remains substantially fixed in space over the operating frequency range of the loudspeaker system.

To achieve a fixed, frequency independent focal point for a loudspeaker system, the horn of the horn loaded high frequency driver is made to be relatively short as measured from the mouth end of the horn to its throat. Preferably the length of the horn is comparable to the depth of the low frequency cone driver, and generally no greater than approximately five inches. By providing a relatively short, properly designed horn operating above the cross-over, a fixed frequency independent system focal point is achievable by introducing amplitude equalization and phase correction to the system. Heretofore, horns have been designed to be relatively long resulting in substantial spacial separation between the frequency dependent focal points of the high and low frequency drivers.

The invention also involves a method for arraying two-way loudspeaker systems in accordance with the invention. In accordance with the method of the invention, at least two two-way loudspeaker systems are provided wherein each of the loudspeaker systems radiates acoustic energy from a common focal point in a polar radiation pattern having amplitude and phase, and wherein the focal point of each of the loudspeaker systems remains substantially fixed over the operating frequency range of the loudspeaker system. Using the common focal points of each loudspeaker system, the loudspeaker systems are arrayed to obtain a desired coverage. Such arrays are created by vertical stacking the loudspeaker systems with the focal points of each loudspeaker system being in substantial vertical alignment. By aligning the focal points of each speaker system, the loudspeaker system can be rotated relative to other loudspeaker systems of the array about a focal axis produced by the aligned focal points of the arrayed loudspeaker systems.

Therefore, a primary object of the present invention is to provide a readily arrayable two way loudspeaker system which includes a horn loaded high frequency driver. It is further an object of the invention to provide a method for easily arraying two or more loudspeakers without producing undesirable combing effects. Other objects of the present invention will be apparent from the following specifications and claims.

DETAILED DESCRIPTION OF THE ILLUSTRATED EMBODIMENT

The loudspeaker system and method of the present invention is principally concerned with the polar response of a loudspeaker in the horizontal plane, and with producing a horizontal polar response from a loudspeaker system that permits two or more loudspeaker systems having overlapping coverages to be easily arrayed without undesirable interactions between the acoustic outputs of the speaker systems. The loudspeaker system and method of the invention also concerns the need to achieve a common focal point about which each speaker can be arrayed. As used herein, the term "focal point," sometimes referred to as an "acoustic center," is understood to mean that point in space about which the speaker can be rotated to achieve a flat amplitude and flat phase response. A "focal axis" is that axis about which the speaker can be rotated to achieve a flat amplitude and flat phase response in the horizonal plane. Such determinations can be made by rotating the speaker relative to a fixed microphone, or rotating a microphone about a fixed speaker.

Figure 1:
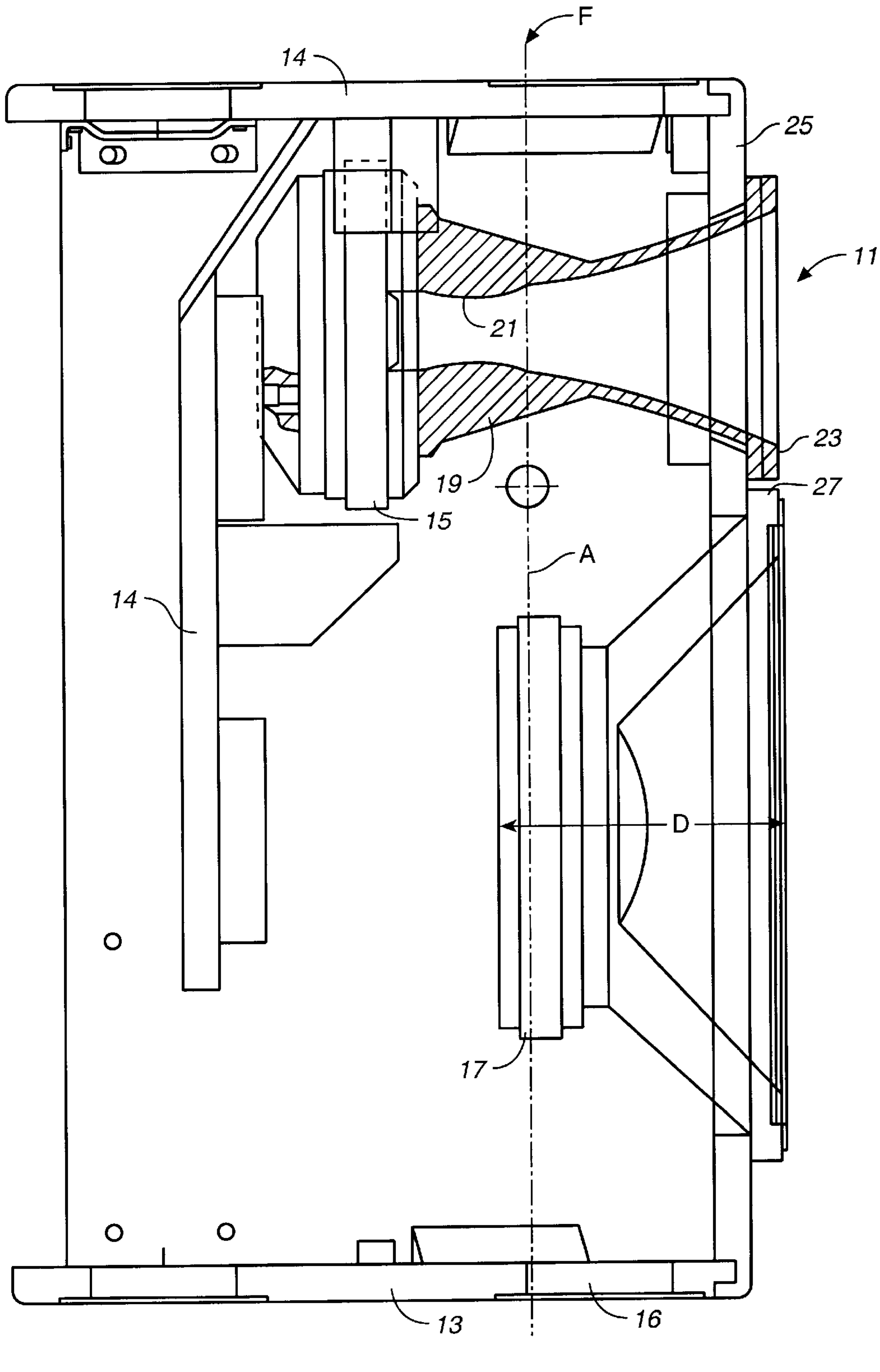
FIG. 1 is a cross-sectional view in side elevation of a arrayable loudspeaker system in accordance with the invention.
Figure 2:
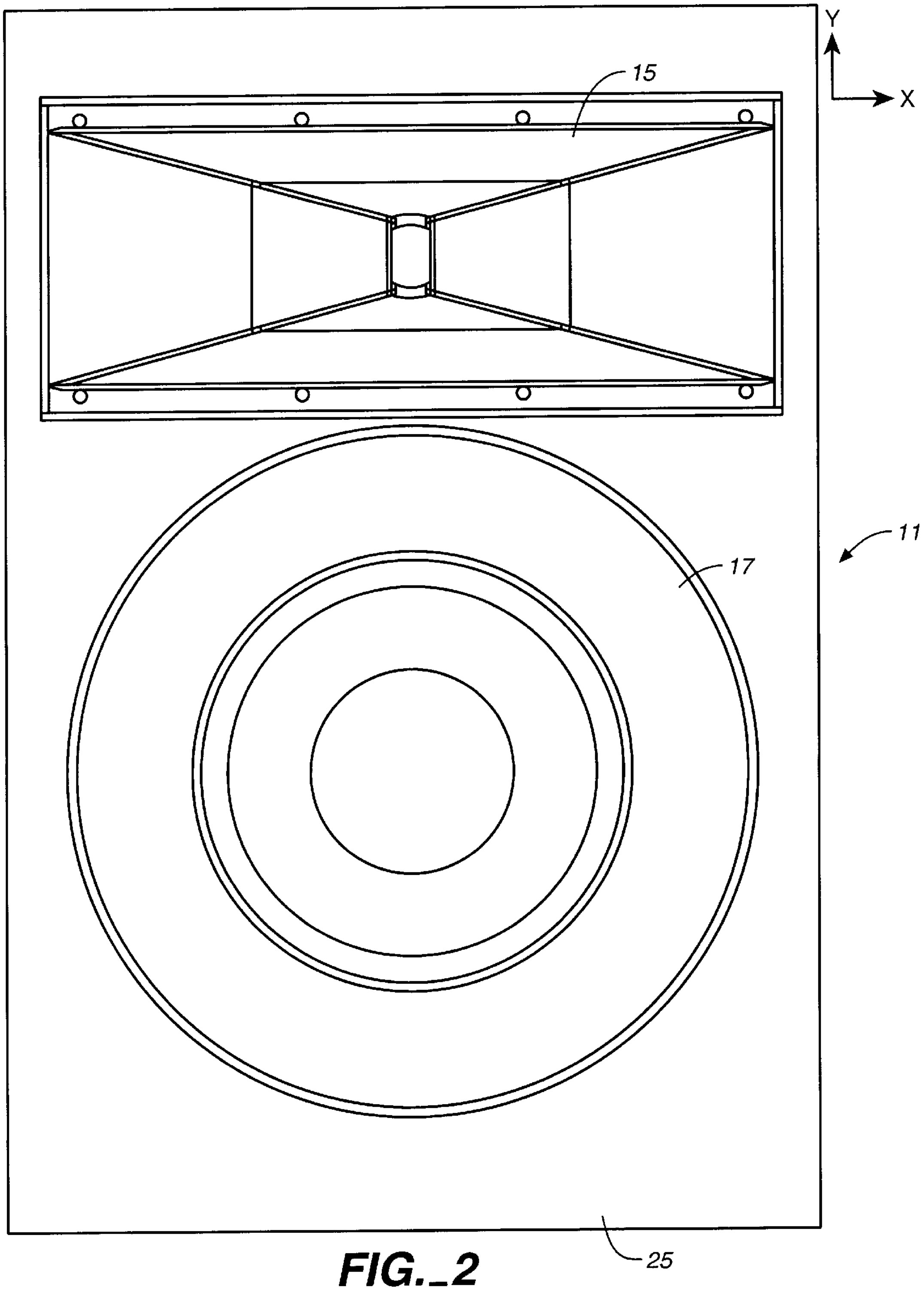
FIG. 2 is a front elevational view thereof.

Referring now to the drawings, FIGS. 1 and 2 show a loudspeaker system 11 having a cabinet 13 which includes a horizontal top and bottom wall 14, 16, a high frequency compression driver 15, and a low frequency cone driver 17, suitably a twelve inch concave cone driver. The high frequency driver 15 includes a horn 19 having a throat end 21 and mouth end 23. The mouth end 23 of horn 19 is mounted to the front baffle board 25 of cabinet 13 above the low frequency driver which is mounted to the baffle board by means of its outer mounting ring 27. The construction of the horn 19 is critical to the desired performance of loudspeaker system 11. Generally, each of the individual high and low drivers 15, 17 will have an focal point in space from which acoustic energy from each driver will appear to radiate. For each individual driver component, the focal point will move forward and backward in the horizontal plane as a function of frequency. As hereinafter described, the speaker system of the present invention, through the design of the horn and the hereinafter described signal conditioning circuitry, produces a frequency independent focal axis A. This creates a frequency independent focal point F in the horizontal plane (see FIG. 1). By providing a common focal point for the system which is independent of frequency, speaker systems in accordance with the invention can be easily arrayed as described below.

Except for the horn 19, the driver components for the high and low drivers 15, 17 can be selected from commercially available parts, provided the parts have a linear response. Thus, driver parts for speaker system 11 will should be carefully selected for their linearity.

Figure 3:
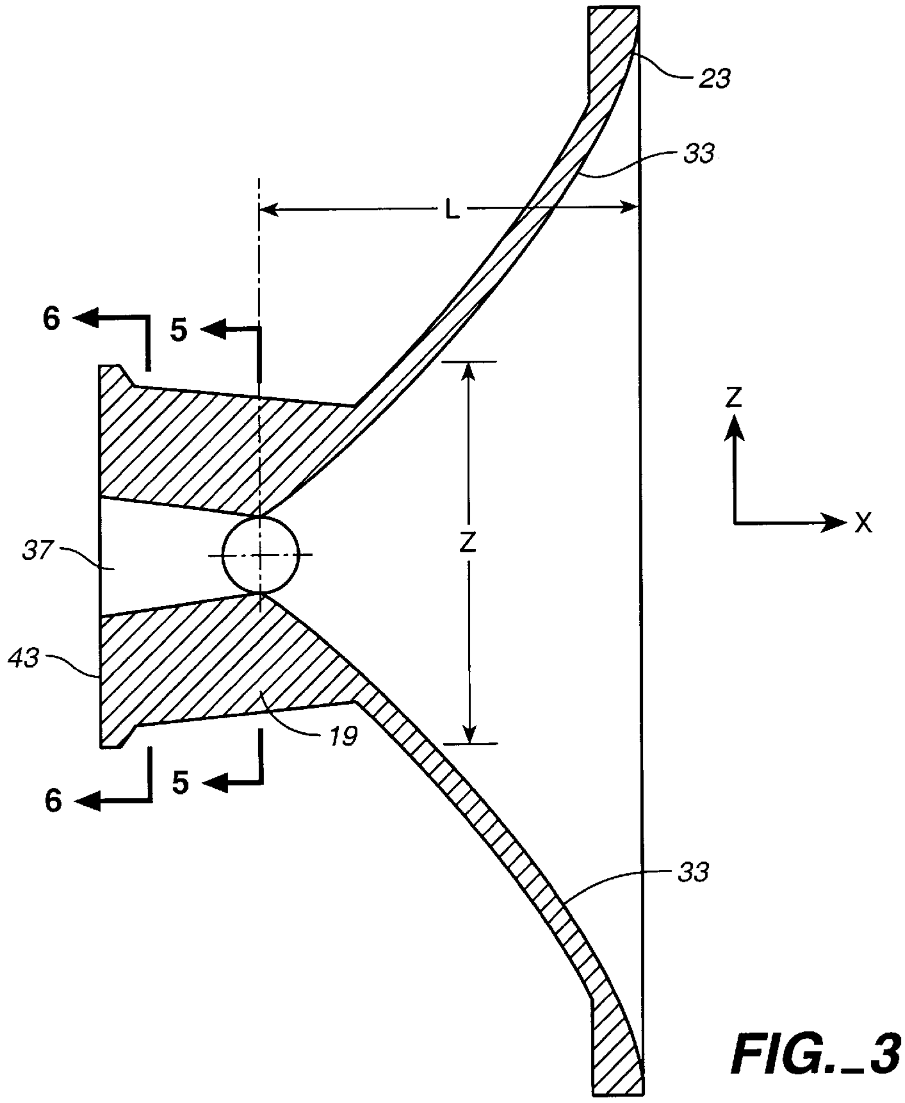
FIG. 3 is a cross-sectional view of the horn for the horn-loaded high frequency driver of the loudspeaker system shown in FIGS. 1–2, taken in the horizontal z-x plane.

The novel horn design of the invention, which in cooperation with signal processing achieves a common system focal point in the horizontal plane, will now be described with reference to FIGS. 3–6. FIG. 3 shows the cross-section of the horn 19 in the horizontal plane represented by the z-x axes. The horn includes a flared section 31 having a defined length denoted by the letter "L" measured from the horn's throat end 21 to its mouth 23 which is relatively short as compared with conventional horn designs. Preferably, the horn's length L is no greater than approximately five inches, a length comparable to the depth of the cone driver denoted by the letter "D" in FIG. 1. By providing a relatively short horn, a common focal axis A can be achieved by suitable signal processing, as hereinafter described.

Figure 4:
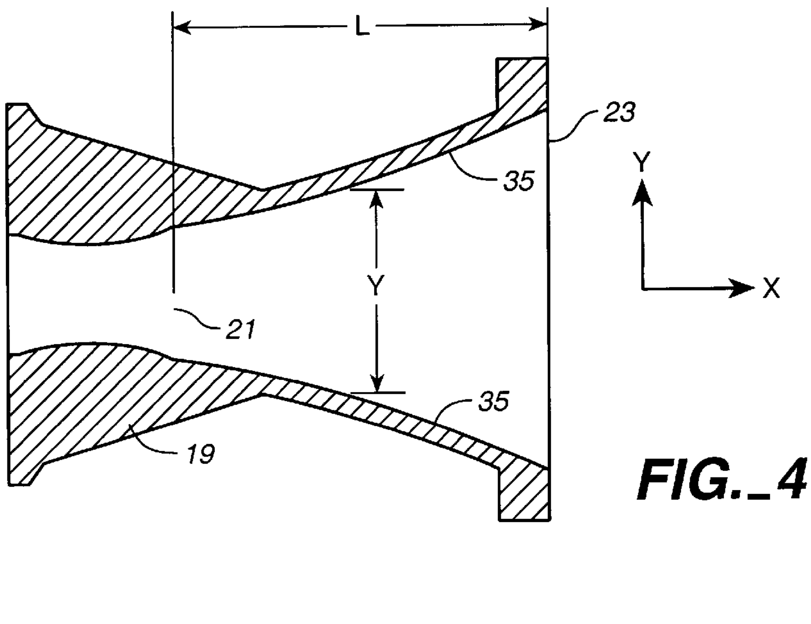
FIG. 4 is a cross-sectional view of the horn shown in FIG. 3 in the y-x vertical plane.

The horn's flared section 31 has a generally rectangular cross-section (as shown in FIG. 2) and has a flare that is defined by the curvature of vertical sidewalls 33 shown in FIG. 3 and horizontal sidewalls 35 shown in FIG. 4. A suitable, empirically determined flare for the horn's vertical and horizontal side walls 33, 35 is expressed by the following equations:

For the horizontal sidewalls where z equals the distance between sidewalls (see FIG. 3):

$$z = 2(.0078x^2 + .1567x + 1)/(.1086x - 1.2859)$$

$$\text{for } x = 0 \text{ to } x = 4.35 \text{ inches}$$

For the vertical sidewalls where $y$ equals the distance between sidewalls (see FIG. 4):

$$y = 2.08922x + .75$$

$$\text{for } x = 0 \text{ to } x = 2.3166 \text{ inches}$$

$$y = 2(-.1531x^2 + .8789x + 1)/(.2439x - 1.3573)$$

$$\text{for } x = 2.3166 \text{ to } x = 4.35$$

The length L of the horn's flared section defined by the above equations is 4.35 inches, and the mouth dimensions are 13.0 inches in the horizontal plane and 4.50 in the vertical plane.

Figure 5:
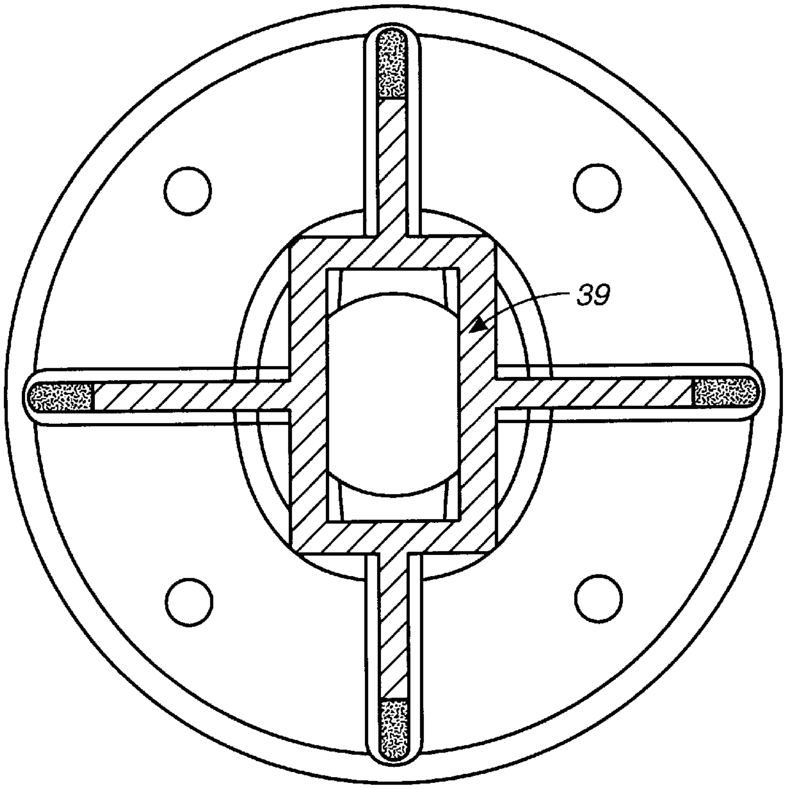
FIG. 5 is a cross-sectional view of the horn of FIG. 3 taken along section lines 5—5.
Figure 6:
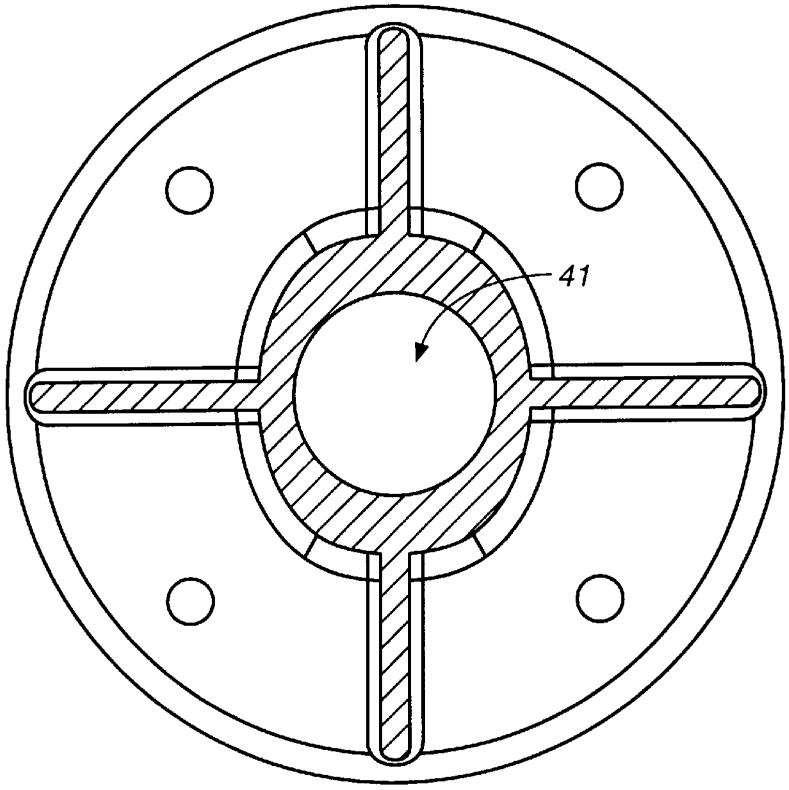
FIG. 6 is a cross-sectional view of the horn shown in FIG. 3 taken along section lines 6—6.

The horn additionally has a pre-load chamber 37 which conditions the phase of the acoustic signal from compression driver 15 before it reaches throat 21 of the horn's flared section 31. The pre-load chamber of the horn is seen to transition smoothly from a rectangular opening 39 as shown in FIG. 5 at the horn's throat 21 to a circular opening 41 at the horn's base end 43. The size and transition rate for a suitable, experimentally determined pre-load chamber can be expressed as follows:

| | |
|---|---|
| Length of pre-load chamber | 1.900 inches |
| Diameter at base end | 1.230 inches |
| Dimensions at throat-- | |
| Width | 0.774 inches |
| Length | 1.554 inches |
| Dimensions at 1.50 inches from base end-- | |
| Width | 0.854 inches |
| Length | 1.321 inches |

It is noted that the flare rate of the horn consists of composite curves consisting of both linear and conical components. It is found that a common focal point is most readily achieved by using combination of such curves.

Figure 7:
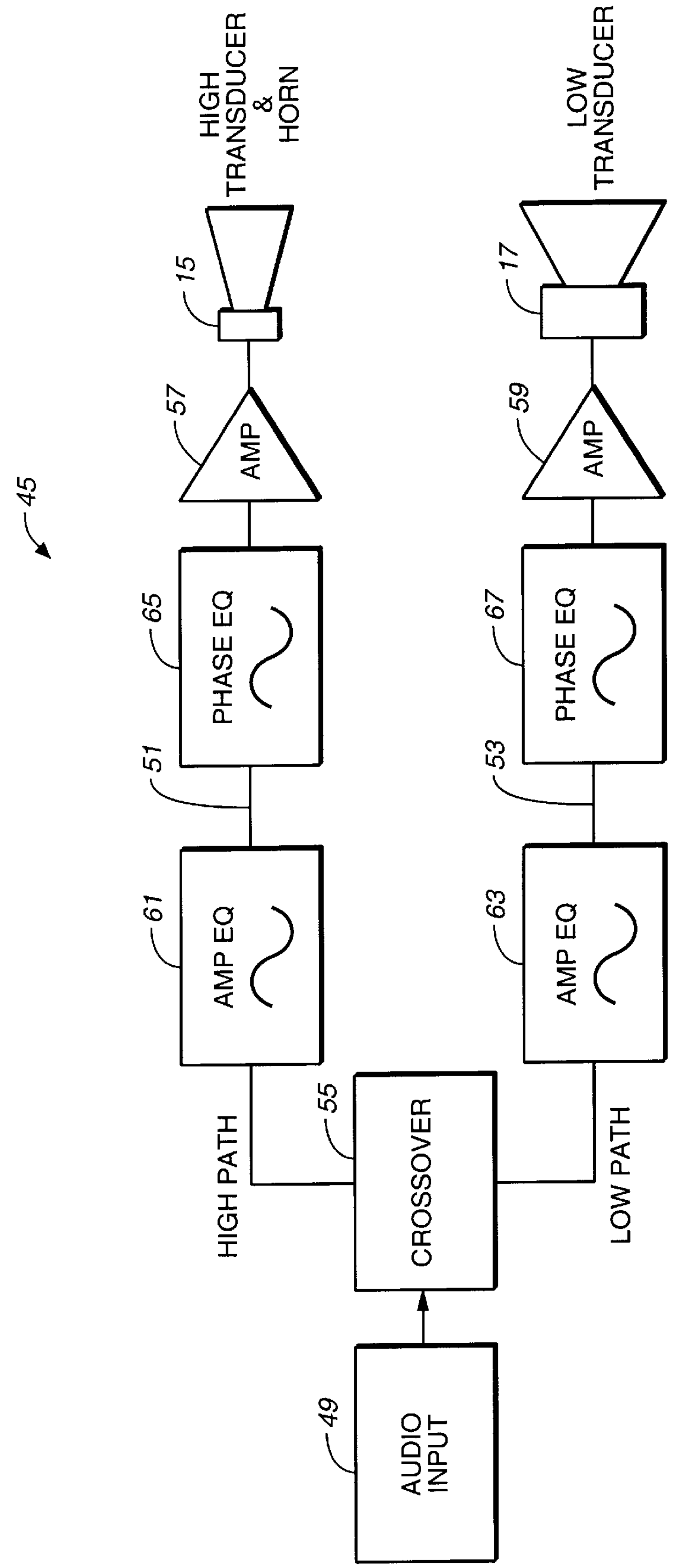
FIG. 7 is a simplified block diagram of a signal conditioning circuit for the loudspeaker system of the invention.

The basic components of the signal conditioning circuitry of the loudspeaker of the invention is illustrated in FIG. 7. The circuit components are suitably mounted internally of the cabinet 13 of the loudspeaker system, such as to internal bracing wall 14 seen in FIG. 1. Referring to FIG. 7, the signal conditioning circuit 45 generally includes an audio signal input 49, a high frequency channel 51 connected to the speaker's high frequency compression driver 15, a low frequency channel 53 connected to the low frequency cone driver 17, and a cross-over circuit 55 for dividing an audio signal applied to audio signal input 49 between the high frequency channel and the low frequency channel. Each of the high and low frequency channels 51 and 53 suitably include its own amplifier 57, 59. Also, each of the high and low frequency channels is provided with amplitude equalization and phase correction as generally indicated by blocks 61, 63 for amplitude equalization and blocks 65, 67 for phase correction. It will be understood that the block diagram of FIG. 7 is representational only, and that amplitude equalization and phase correction can be provided by a number of circuit implementations, including using equalization and/or phase correction circuits before the crossover.

Figure 8:
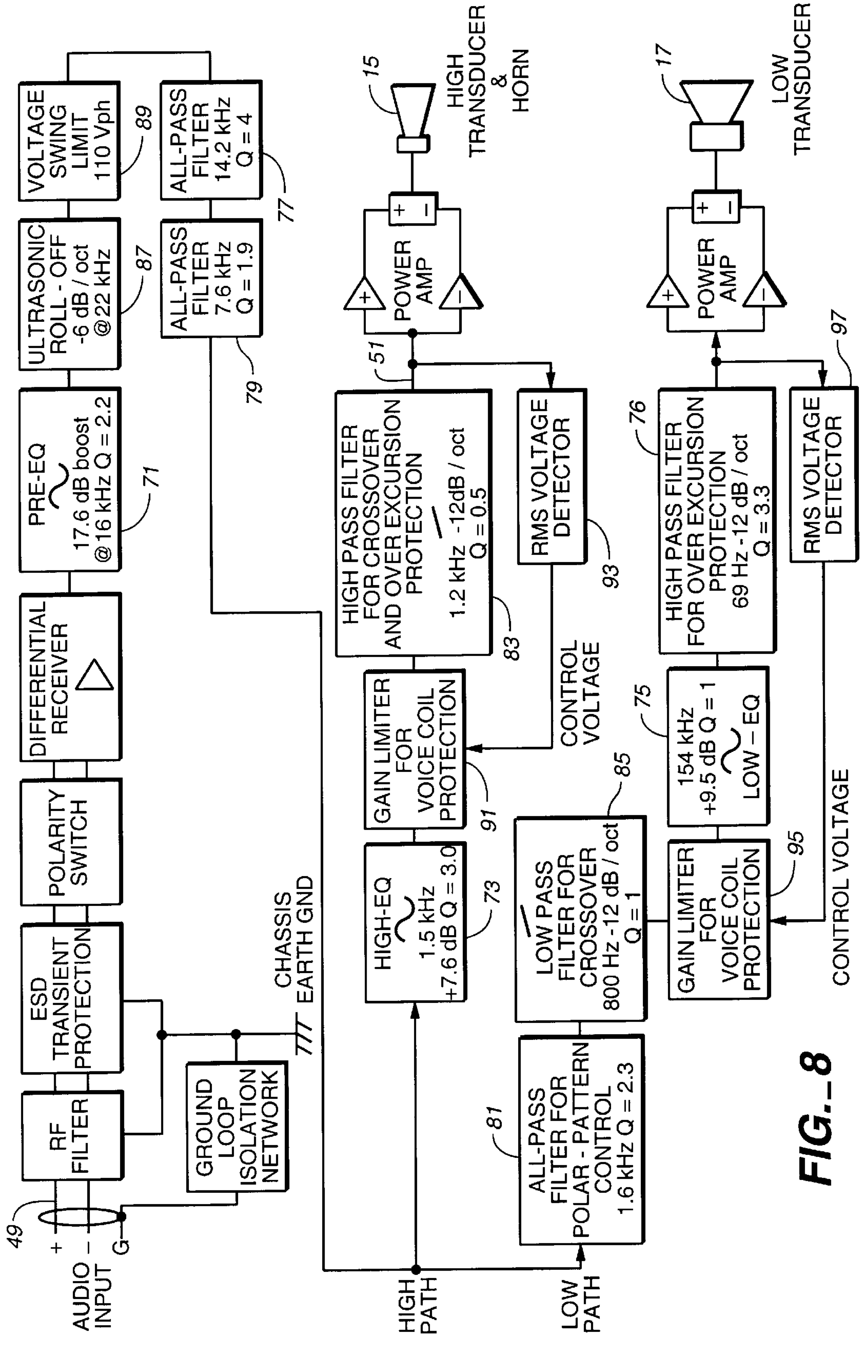
FIG. 8 is a more detailed block diagram of a signal conditioning circuit of the invention.

FIG. 8 shows in greater detail a particular implementation of the required crossover circuit, amplitude equalization circuits and phase correction circuits generally illustrated in FIG. 7, together with other desirable circuit elements. The particular circuit illustrated in FIG. 8, is suitable for use with the horn design illustrated and described above.

The FIG. 8 circuit includes series amplitude equalization circuitry represented by a pre-EQ block 71 and further amplitude equalization circuits (blocks 73 and 75) in the high frequency channel and low frequency channel. Phase correction is provided by means of series all-pass filters 77, 79 and an additional all-pass filter 81 in the low frequency channel. High pass filter 83 in the high frequency channel and low pass filter 85 in the low frequency channel provide the necessary crossover circuit. High pass filter 83 also provides over excursion protection for the high frequency driver 15.

The circuit illustrated in FIG. 8 further includes an ultrasonic roll-off circuit 87 which contributes to the high channel amplitude equalization by rolling off the audio signal above the operating frequency range of the loudspeaker system. A voltage swing limiting circuit 89 is provided between roll-off circuit 87 and all-pass circuit 77 to prevent the all-pass circuit from introducing undesirable clipping in the audio output.

The signal conditioning circuit of FIG. 8 still additionally includes protection circuitry, such as a gain limiter 91 inserted in the high channel before high pass filter 83 for protecting the high driver voice coil, and an RMS voltage detector 93 which drives the gain limiter. A similar gain limiter and RMS voltage detector 95, 97 can be provided in the low channel for protecting the voice coil of the low frequency driver.

To achieve a common focal point for the loudspeaker system of the invention, the horn 19 of the high frequency compression driver 15 and the signal conditioning circuit 45 must be designed through an iterative process wherein a horn design and circuit parameters for the circuit conditioning circuit are chosen based on a desired result and wherein the horn design and signal conditioning circuit are modified or adjusted until a common focal point for the speaker system is arrived at. Such a process involves choosing an initial design which is predicted to achieve an approximate target result, and then, iteratively, performing the following steps: 1) measuring the amplitude and phase around the vertical polar axis (in the horizontal plane) of the loudspeaker system over its operating frequency range, and 2) making modifications and adjustments to achieve both the flattest possible amplitude and phase response over the desired frequency range. These steps are repeated until a suitably flat amplitude and phase response is achieved. Measurements should be far field measurements, suitably with a microphone placed about ten feet from the speaker.

A signal conditioning circuit as illustrated in FIG. 8 has been used with the horn design described above to produce a two-way loudspeaker system having a horizontal beam width (at −6 dB) of 100 degrees which permits wide coverage to be achieved with fewer speakers—360 degrees of coverage can be obtained with just four speakers. The parameter of the signal conditioning circuit used to achieve such performance and to achieve the required fixed focal point are as follows:

| | |
|---|---|
| Pre-EQ (block 71) | 17.6 db boost at 16 Khz<br>Q = 2.2 |
| Ultrasonic roll-off<br>(block 87) | high frequency roll-off = 6 dB/octave<br>at 22 KHz |
| Series all-pass filter 77 | cut-off frequency = 14.2 KHz<br>Q = 4 |
| Series all-pass filter 79 | cut-off frequency = 7.2 KHz<br>Q = 1.9 |
| All-pass filter 81<br>(in low channel) | cut-off frequency = 1.6 KHz<br>Q = 2.3 |
| Amplitude EQ<br>circuit 73<br>(in high channel) | + 7.6 dB boost<br>at 1.5 KHz<br>Q = 3.0 |
| Amplitude EQ<br>circuit 75<br>(in low channel) | + 9.5 dB boost<br>at 154 Hz<br>Q = 1 |
| High-Pass Filter 83<br>for cross-over and<br>over excursion protection | cut-off frequency = 1.2 KHz<br>roll-off = 12 db/octave<br>Q = 0.5 |
| Low-Pass Filter 85<br>for cross-over | cut-off frequency = 800 Hz<br>roll-off = −12 db/octave<br>Q = 1 |
| High-Pass filter 76<br>for over excursion<br>protection | cut-off frequency = 69 Hz<br>roll-off = −12 db/octave<br>Q = 3.3 |

Figure 9:
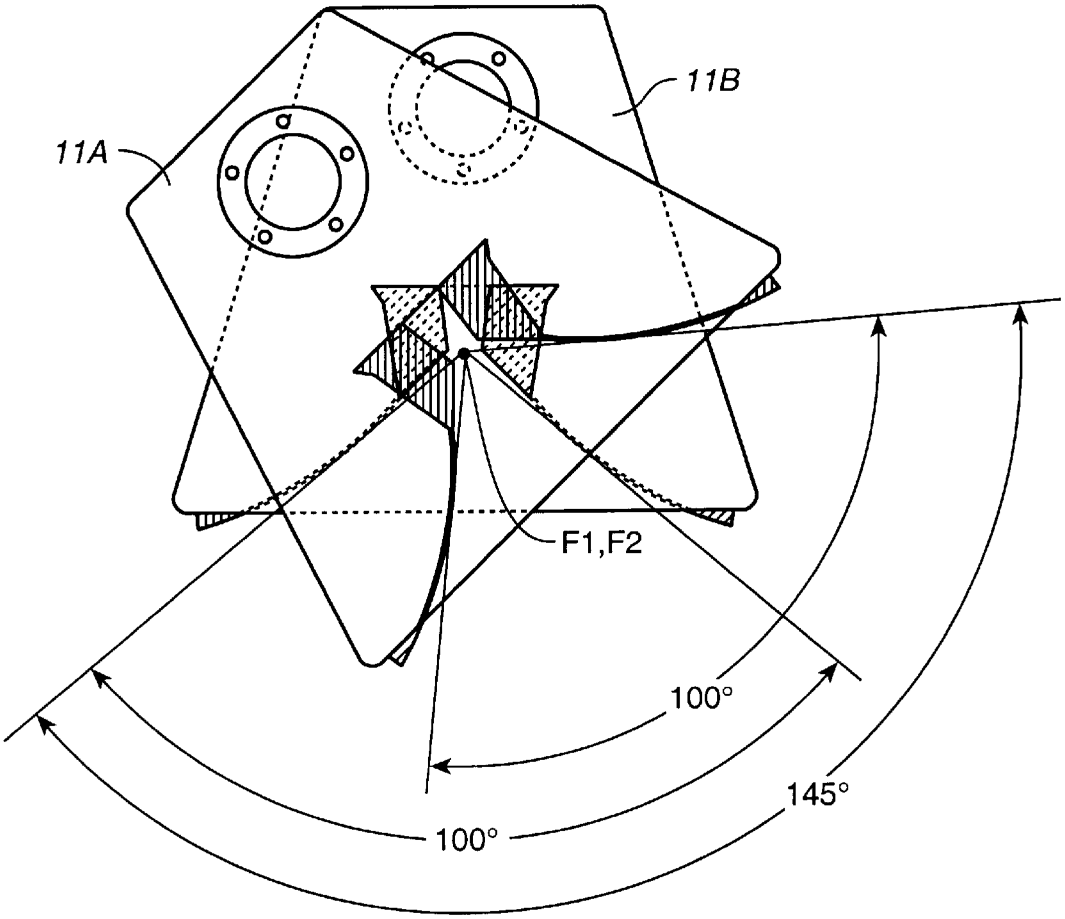
FIG. 9 is a top plan view of two vertically stacked loudspeaker systems arrayed in accordance with the method of the invention.
Figure 10:
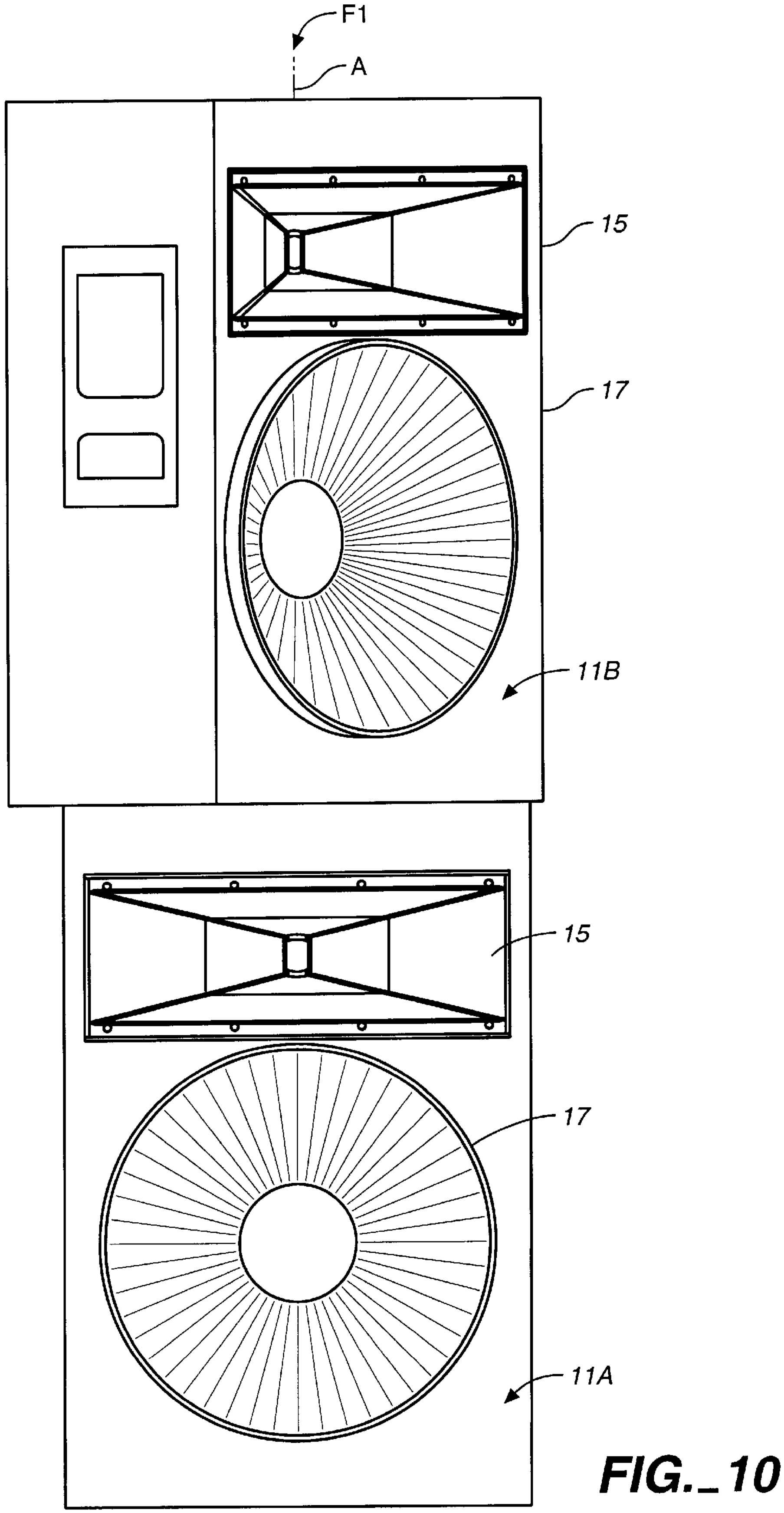
FIG. 10 is a front elevational view of the array shown in FIG. 9.

FIGS. 9 and 10 show two loudspeaker systems 11*a* and 11*b* having fixed focal points F1 and F2 arrayed in accordance with the method of the invention. The method is particularly adapted to use with loudspeakers having relatively wide coverage angles, such as the two-way loudspeaker system above described. Referring to FIGS. 9 and 10, the method of the invention requires that the loudspeakers 11*a*, 11*b* be vertically stacked such that their focal points F1, F2 are substantially aligned to provide a common focal axis A. By vertically aligning the speakers in reference to their fixed focal points, the resulting array will provide an output of acoustical energy that is simply the sum of the output of both speakers, without producing undesirable lobing or cancellations. By rotating one or the other of the vertically stacked speakers 11*a*, 11*b* about common focal axis A, different predictable coverages can be attained. For instance, the two speakers can be pointed in the same direction to boost power without increasing angles of coverage, or the speakers can be rotated such that their beams overlap for only a small portion of their coverage angles thereby maximally increasing the coverage of the array. Alternatively, the beams of both speakers can be made to substantially overlap to increase coverage while boosting power in the region of overlap. (See overlap region in FIG. 9.) Additional vertically stacked speakers made in accordance with the invention can be added to the array for additional power and/or coverage as required. By arraying such additional speakers along the provided common focal axis, additional power and coverage can be achieved without the undesirable combing effects normally associated with speaker arrays.

Preferably, visual indicia or a mechanical locating device will be placed at the top and/or bottom of each speaker cabinet 13 at the measured focal point of the speaker system to assist the user in vertically stacking the speaker systems along the focal axis A. A visual indicator can suitably be provided by a visually prominent dot or circle painted or otherwise applied to the top and bottom of the speaker cabinet. A mechanical locator device can include the provision of locator pin holes in the top and bottoms of the speaker cabinets at the focal axis, along with locator pins for joining speakers together in a properly aligned stacked arrangement.

While the invention has been described in considerable detail in the foregoing specification and the accompanying drawings, it is understood that it is not intended that the invention be limited to such detail, except as necessitated by the following claims.

What is claimed is:

1. An arrayable at least two way loudspeaker system having an operating frequency range including a high frequency range and a low frequency range, and which radiates acoustic energy from a focal point in a polar radiation pattern having amplitude and phase, said loudspeaker system comprising a cabinet having top wall, a bottom wall, and a front baffle board, a low frequency cone driver mounted to the front baffle board of said cabinet, a horn-loaded high frequency compression driver, said horn-loaded high frequency driver including a horn having a mouth end and a throat end, the mouth end of said horn being mounted to the front baffle board of said cabinet adjacent said low frequency driver, and a signal conditioning circuit including a audio signal input, a high frequency channel connected to said high frequency compression driver, a low frequency channel connected to said low frequency cone driver, and a cross-over circuit for dividing an audio signal applied to said audio signal input between said high frequency channel and low frequency channel, said signal conditioning circuit further including amplitude equalization circuit means for equalizing the amplitude of the polar pattern of the loudspeaker system over the operating frequency range of the loudspeaker system, and phase correction circuit means for correcting the phase of said polar pattern, and the horn of said horn-loaded high frequency driver and said signal conditioning circuit being designed to operate in cooperation with each other such that the focal point of the loudspeaker system is a frequency independent focal point that remains substantially fixed over substantially the entire operating frequency range of the loudspeaker system and such that acoustic energy from the at least two drivers of the loudspeaker system radiates in a polar pattern from said fixed frequency independent focal point.

2. The loudspeaker system of claim 1 wherein the horn of said horn-loaded high frequency driver has a relatively short length as measured from the mouth end to the throat end of said horn.

3. The loudspeaker system of claim 2 wherein said low frequency cone driver has a depth measured from the baffle board of said cabinet and wherein the length of said horn is not substantially greater than the depth of said low frequency cone driver.

4. The loudspeaker system of claim 3 wherein the length of said horn is no greater than approximately 5 inches.

5. The loudspeaker system of claim 1 wherein visually indicia is provided in the top wall of said speaker cabinet to visual locate said focal point.

6. A method of producing sound from arrayed loudspeaker systems comprising the steps of providing at least two loudspeaker systems, each said loudspeaker system being at least a two way speaker system having at least one horn loaded driver, and each said loudspeaker system being designed to have a frequency independent focal point that remains substantially fixed in space over substantially the entire operating frequency range of said loudspeaker system, wherein acoustic energy from each said loudspeaker system is radiated in a solar radiation pattern from said fixed frequency independent focal point, and arraying said at least two loudspeaker systems by substantially aligning the focal points of said loudspeaker system and rotating said loudspeaker systems about an axis passing through said aligned focal points to obtain a desired coverage.

7. The method of claim 6 wherein said loudspeaker systems are arrayed by vertical stacking with the focal points of the loudspeaker systems substantially vertically aligned.

8. The method of claim 7 wherein said vertically stacked loudspeaker systems are arrayed by rotating one of said loudspeaker systems relative to the other of said loudspeaker systems about an axis passing through the focal points thereof.

9. The method of claim 7 wherein an indicator is provided at the top and bottom of said loudspeaker systems for locating the focal points thereof, and wherein said loudspeaker systems are aligned to said indicators.

10. The method of claim 9 wherein said indicator is a mechanical locator.

11. The method of claim 10 wherein said indicator is a visual indicator.

* * * * *